United States Patent
Alpert et al.

(10) Patent No.: US 8,458,634 B2
(45) Date of Patent: Jun. 4, 2013

(54) LATCH CLUSTERING WITH PROXIMITY TO LOCAL CLOCK BUFFERS

(75) Inventors: Charles Jay Alpert, Austin, TX (US); Zhuo Li, Austin, TX (US); Gi-Joon Nam, Austin, TX (US); David Anthony Papa, Austin, TX (US); Chin Ngai Sze, Austin, TX (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 12/912,919

(22) Filed: Oct. 27, 2010

(65) Prior Publication Data

US 2012/0110532 A1    May 3, 2012

(51) Int. Cl.
   *G06F 17/50*       (2006.01)
(52) U.S. Cl.
   USPC .......................................................... 716/114
(58) Field of Classification Search
   USPC ................................................. 716/118–125
   See application file for complete search history.

(56) References Cited

U.S. PATENT DOCUMENTS

| | | | |
|---|---|---|---|
| 6,351,840 B1 * | 2/2002 | Teng ............................... | 716/122 |
| 6,440,780 B1 | 8/2002 | Kimura et al. | |
| 6,442,739 B1 | 8/2002 | Palermo et al. | |
| 6,609,228 B1 * | 8/2003 | Bergeron et al. ............. | 716/113 |
| 6,920,625 B2 | 7/2005 | Gass | |
| 7,020,861 B2 | 3/2006 | Alpert et al. | |
| 7,459,940 B2 | 12/2008 | Franch | |
| 7,549,137 B2 | 6/2009 | Alpert et al. | |
| 7,624,366 B2 | 11/2009 | Alpert et al. | |
| 2004/0031001 A1 * | 2/2004 | Zhang et al. ...................... | 716/4 |
| 2008/0148203 A1 * | 6/2008 | Alpert et al. ...................... | 716/6 |
| 2009/0193377 A1 | 7/2009 | Puri et al. | |
| 2009/0210832 A1 | 8/2009 | Wood | |

OTHER PUBLICATIONS

Wang et al; "Low Power Clock Buffer Planning Methodology in F-D Placement for Large Scale Circuit Design", IEEE, 2008, pp. 370-375.

* cited by examiner

*Primary Examiner* — Vuthe Siek
*Assistant Examiner* — Aric Lun
(74) *Attorney, Agent, or Firm* — Garg Law Firm, PLLC; Rakesh Garg; Eustus D. Nelson

(57) ABSTRACT

A method, system, and computer usable program product for latch clustering with proximity to local clock buffers (LCBs) where an algorithm is used to cluster a plurality of latches into a first plurality of groups in an integrated circuit. A number of groups in the first plurality of groups of clustered latches is determined. A plurality of LCBs are added where a number of added LCBs is the same as the number of groups in the first plurality of groups. A cluster radius for a subset of the first plurality of groups of clustered latches is determined, a group in the subset having a cluster radius that is a maximum cluster radius in the subset. The plurality of latches are reclustered into a second plurality of groups responsive to the maximum cluster radius exceeding a radius threshold, the second plurality of groups exceeding the first plurality of groups by one.

17 Claims, 6 Drawing Sheets

FIG. 3
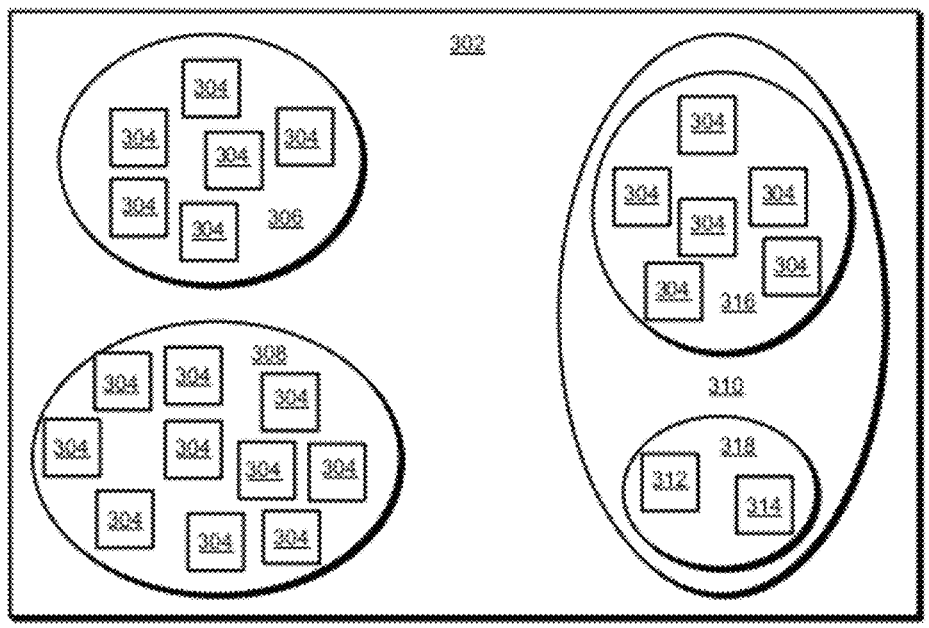
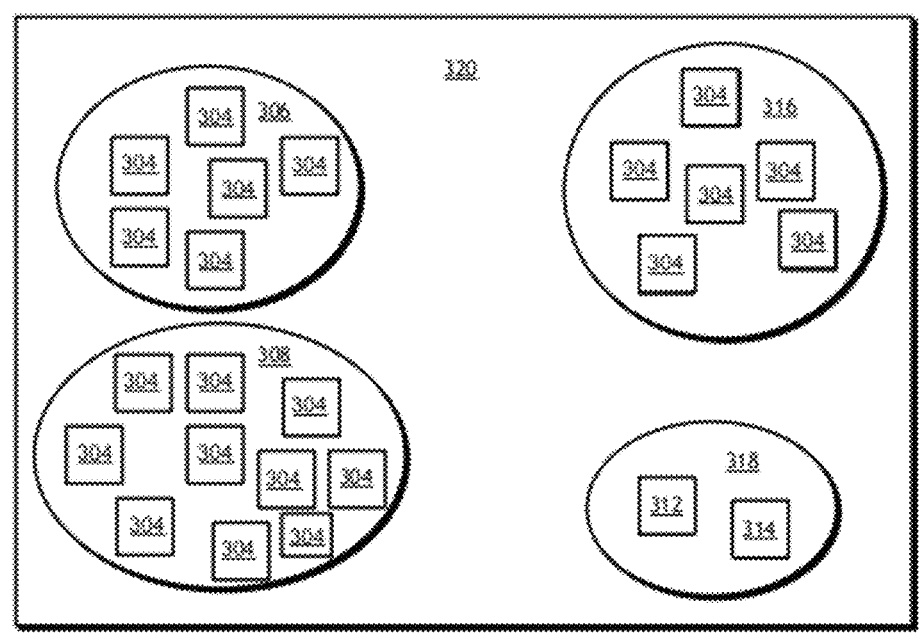

LATCH CLUSTERING WITH PROXIMITY TO LOCAL CLOCK BUFFERS

BACKGROUND OF THE INVENTION

1. Field of the Invention

The present invention relates generally to a clock distribution network, and in particular, to a computer implemented method for managing the placement of local clock buffers. More particularly, the present invention relates to a computer implemented method, system, and computer usable program code for managing latch clustering with proximity to local clock buffers.

2. Description of the Related Art

Cell placement in semiconductor fabrication involves a determination of where particular cells should optimally (or near-optimally) be located on the surface of an integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have been partially or fully automated. Several different programming languages have been created for electronic design automation (EDA) including Verilog (Verilog is a trademark of the Gateway Design Automation Corporation in the United States), VHDL and TDML. A typical EDA system receives one or more high level behavioral descriptions of an integrated circuit (IC) device, and translates this high level design language description into netlists of various levels of abstraction.

While current placement techniques provide adequate placement of cells with regard to their data interconnections, there is an additional challenge for the designer in constructing a clock network for the cells. In a synchronous digital system, a clock signal is used to define a time reference for the movement of data within the system. The clock distribution network, or clock tree, distributes the clock signal from a common point to all the elements that need the clock signal.

The difference in the arrival time of a common clock signal at various locations in the physical layout of an integrated circuit design is called clock skew. The variation in the clock period at various locations in the physical layout of an integrated circuit design is called jitter. Both clock skew and clock jitter may result in decreased performance capability in terms of maximum operating frequency and in circuit malfunction from setup and hold time violations.

Constructing a clock network for the cells is becoming more difficult with the latest technologies like low-power 65-nanometer integrated circuits. Low power circuits such as those around 20 Watts or less for microprocessor chips are becoming more prevalent due to power consumption problems. In particular, power dissipation has become a limiting factor for the yield of high-performance circuit designs with deep submicron technology. Clock nets can contribute up to 50 percent of the total active power in multi-GHz designs. Low power designs are also preferable since they exhibit less power supply noise and provide better tolerance with regard to manufacturing variations.

There are several techniques for minimizing power while still achieving timing objectives for high performance, low power systems. One method involves the use of local clock buffers (LCBs) to distribute the clock signals. A typical clock control system has a clock generation circuit that generates a master clock signal which is fed to a clock distribution network that renders synchronized global clock signals at the LCBs. Each LCB adjusts the global clock duty cycle and edges to meet the requirements of respective circuit elements, e.g., local logic circuits or latches. Typically, a proximity constraint or distance from a latch to a LCB is required to ensure the clock skew and clock jitter are within desired tolerances.

Because the clock network is one of the largest power consumers among all of the interconnected components, controlling the capacitive load of the LCBs may be beneficial. One approach for reducing the capacitive load is latch clustering, or clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

Conventional placement begins with an initial placement of the latches based on a layout for the circuit. The layout can be provided by an EDA tool that places the latches in an optimal placement for each logic cells. The latches are grouped into a given latch cluster based on locality and clock domain. The LCB for a given clock domain is located at the center of the latch cluster and the latches are pulled to the LCB. However, as the latches are pulled to the LCB, the latches become displace away from their optimal placement and timing degradation can occur. An improved placement method that could balance between timing degradation and latch to LCB timing constraints would therefore be desirable.

SUMMARY OF THE INVENTION

The illustrative embodiments provide a method, system, and computer usable program product for latch clustering with proximity to local clock buffers. An embodiment clusters a plurality of latches into a first plurality of groups in an integrated circuit, where the plurality of latches are clustered using a clustering algorithm. The embodiment determines a number of groups in the first plurality of groups of clustered latches. The embodiment adds a plurality of local clock buffers (LCBs) where a number of added LCBs in the plurality of local clock buffers is the same as the number of groups in the first plurality of groups of clustered latches. The embodiment determines a cluster radius for a subset of the first plurality of groups of clustered latches, a group in the subset having a cluster radius that is a maximum cluster radius in the subset. The embodiment reclusters the plurality of latches into a second plurality of groups responsive to the maximum cluster radius exceeding a radius threshold, the second plurality of groups exceeding the first plurality of groups by one.

BRIEF DESCRIPTION OF THE DRAWINGS

The novel features believed characteristic of the invention are set forth in the appended claims. The invention itself however, as well as a preferred mode of use, further objectives and advantages thereof, will best be understood by reference to the following detailed description of an illustrative embodiment when read in conjunction with the accompanying drawings, wherein:

FIG. 3 depicts a block diagram with respect to latch clustering with proximity to local clock buffers in accordance with an illustrative embodiment;

DETAILED DESCRIPTION OF THE PREFERRED EMBODIMENT

Figure 1:
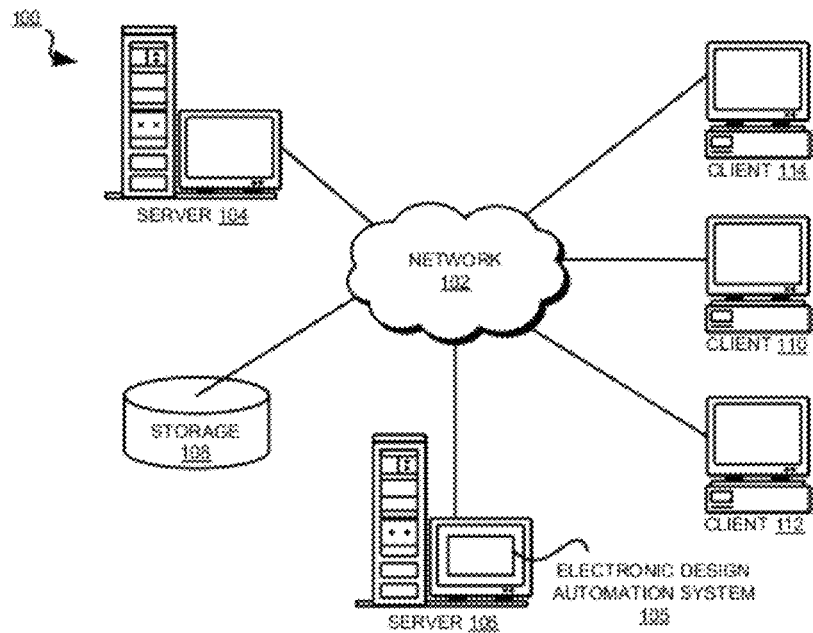
FIG. 1 depicts a pictorial representation of a network of data processing systems in which the illustrative embodiments may be implemented.

The invention recognizes that during clock optimization, latches are optimally placed near logic gates by an electronic design automation system and all the latches are grouped together into groups. A LCB is placed in each group. The latches in a group are often moved from their optimal placement by the electronic design automation system to a position closer to the LCB in the group in order to satisfy a proximity constraint and avoid a clock skew that is outside the tolerance of the system.

However, by moving a latch away from the latch's optimal placement, a timing degradation may be created as the distance between the logic gate and the latch is increased. A balance between timing degradation and latch to LCB timing constraints needs to be employed to properly optimize the clock design.

The illustrative embodiments used to describe the invention generally address and solve the above-described problems and other problems related to latch clustering with proximity to local clock buffers. The illustrative embodiments of the invention provide a method, computer usable program product, and processing system for managing latch clustering with proximity to local clock buffers.

The term "latch" is used to refer to a latch, flip-flop, register, or some other bistable multivibrator. The term "local clock buffer" is used to refer to a local clock buffer, latch driver, or any repeater or buffer that drives a latch.

The illustrative embodiments are described with respect to data, data structures, and identifiers only as examples. Such descriptions are not intended to be limiting on the invention. For example, an illustrative embodiment described with respect to single piece of information may be implemented using a combination of several pieces of information, in a similar manner within the scope of the invention.

Furthermore, the illustrative embodiments may be implemented with respect to any type of data processing system. For example, an illustrative embodiment described with respect to a single-processor standalone data processing system may be implemented in a multiprocessor logical partition system, or any other organization of data processing systems, such as rack configurations in a data center, within the scope of the invention. As another example, an embodiment of the invention may be implemented with respect to any type of client system, server system, platform, or a combination thereof.

The illustrative embodiments are further described with respect to certain parameters, attributes, and configurations only as examples. Such descriptions are not intended to be limiting on the invention. For example, an illustrative embodiment described with respect to numeric attribute may be implemented using an alphanumeric attribute, a symbolic attribute, or a combination thereof, in a similar manner within the scope of the invention.

An application implementing an embodiment may take the form of data objects, code objects, encapsulated instructions, application fragments, drivers, routines, services, systems—including basic I/O system (BIOS), and other types of software implementations available in a data processing environment. For example, Java® Virtual Machine (JVM®), Java® object, an Enterprise Java Bean (EJB®), a servlet, or an applet may be manifestations of an application with respect to which, within which, or using which, the invention may be implemented. (Java, JVM, EJB, and other Java related terminologies are registered trademarks of Sun Microsystems, Inc. in the United States and other countries.)

An illustrative embodiment may be implemented in hardware, software, or a combination thereof. The examples in this disclosure are used only for the clarity of the description and are not limiting on the illustrative embodiments. Additional or different information, data, operations, actions, tasks, activities, and manipulations will be conceivable from this disclosure for similar purpose and the same are contemplated within the scope of the illustrative embodiments.

The illustrative embodiments are described using specific code, data structures, file systems, designs, architectures, layouts, schematics, and tools only as examples and are not limiting on the illustrative embodiments. Furthermore, the illustrative embodiments are described in some instances using particular data processing environments only as an example for the clarity of the description. The illustrative embodiments may be used in conjunction with other comparable or similarly purposed structures, systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
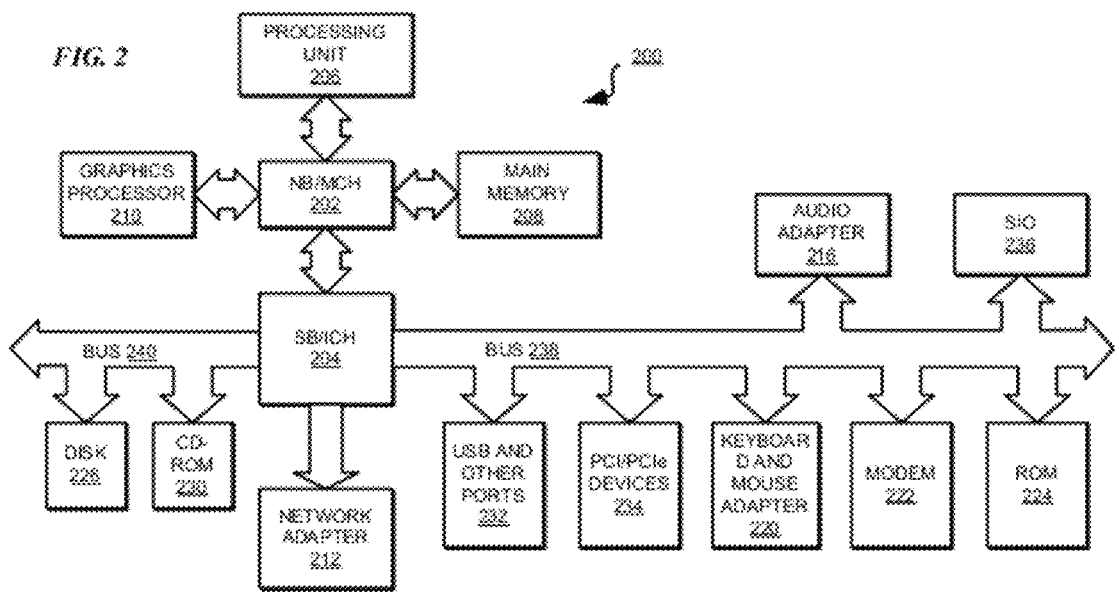
FIG. 2 depicts a block diagram of a data processing system in which the illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon. For example, server 106 may include electronic design automation system 105 usable for performing certain tasks in designing an integrated circuit.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client server environment in which the illustrative embodiments may be implemented. A client server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations. In some configurations, processing unit 206 may include NB/MCH 202 or parts thereof.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). In some configurations, ROM 224 may be an Electrically Erasable Programmable Read-Only Memory (EEPROM) or any other similarly usable device. Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java is a trademark of Sun Microsystems, Inc., in the United States and other countries).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

With reference to FIG. 3, this figure depicts a block diagram of an example of optimal latch placement by an electronic design automation system that may be improved using an illustrative embodiment. The depicted latch placement may be implemented using electronic design automation system 105 in FIG. 1. As shown in first latch clustering example 302, latches 304 in first latch cluster 306 are relatively close to each other and latches 304 in second latch cluster 308 are relatively close to each other. However, in third latch cluster 310, first latch set 316 is relatively far away from second latch set 318. Second latch set 318 contains latch 312 and latch 314. A latch set, or set of latches, is one or more latches.

The numbers of groupings, clusters, or sets, and the number of latches depicted therein are only depicted as examples and not as a limitation on the invention. Any number of groupings, clusters, sets, or latches may be similarly used in conjunction with an embodiment of the invention within the scope of the invention. In first latch clustering example 302, the electronic design automation system for the clock network is configured to use a minimum number of LCBs. The minimum number of LCBs is based on the number of initial latch clusters as determined by the electronic design automation system. Because there are at most three (3) clusters of latches, first latch cluster 306, second latch cluster 308, and third latch cluster 310, only three (3) LCB will be used. A first LCB could be placed in first latch cluster 306, a second LCB could be placed in second latch cluster 308, and a third LCB could be placed in third latch cluster 310.

The proximity constraint for the first LCB and latches 304 in first latch cluster 306 and the second LCB and latches 304 in second latch cluster 308 may be acceptable according to a design consideration. However, the proximity constrain for third latch cluster 310 may not be acceptable. For example, if the third LCB is placed near first latch set 316, then the distance from the third LCB to latches 312 and 314 may produce a clock skew that is outside the tolerance of the system. Latches 312 and 314 could be moved closer to the third LCB and first latch set 316, but then an unacceptable timing degradation may be introduced.

In second latch clustering example 320, the electronic design automation system for the clock network is set so up to four (4) LCBs may be used. As in first latch clustering example 302, in first latch cluster 306 and second latch cluster 308 latches 304 are relatively close. However, in third latch cluster 310, first latch set 316 is relatively far away from second latch set 318.

Because four (4) LCBs can be placed in the circuit design instead of three (3) as in first latch clustering example 302, a first LCB could be placed in first latch cluster 306, a second LCB could be placed in second latch cluster 308, a third LCB could be placed in first latch set 316, and a fourth LCB could be place in second latch set 318. In contrast to the potential timing degradation issue in first latch clustering example 302, latches 312 and 314 do not need to be moved far from their optimal placement because the proximity constraint for the fourth LCB and latches 312 and 314 may be acceptable.

Figure 4:
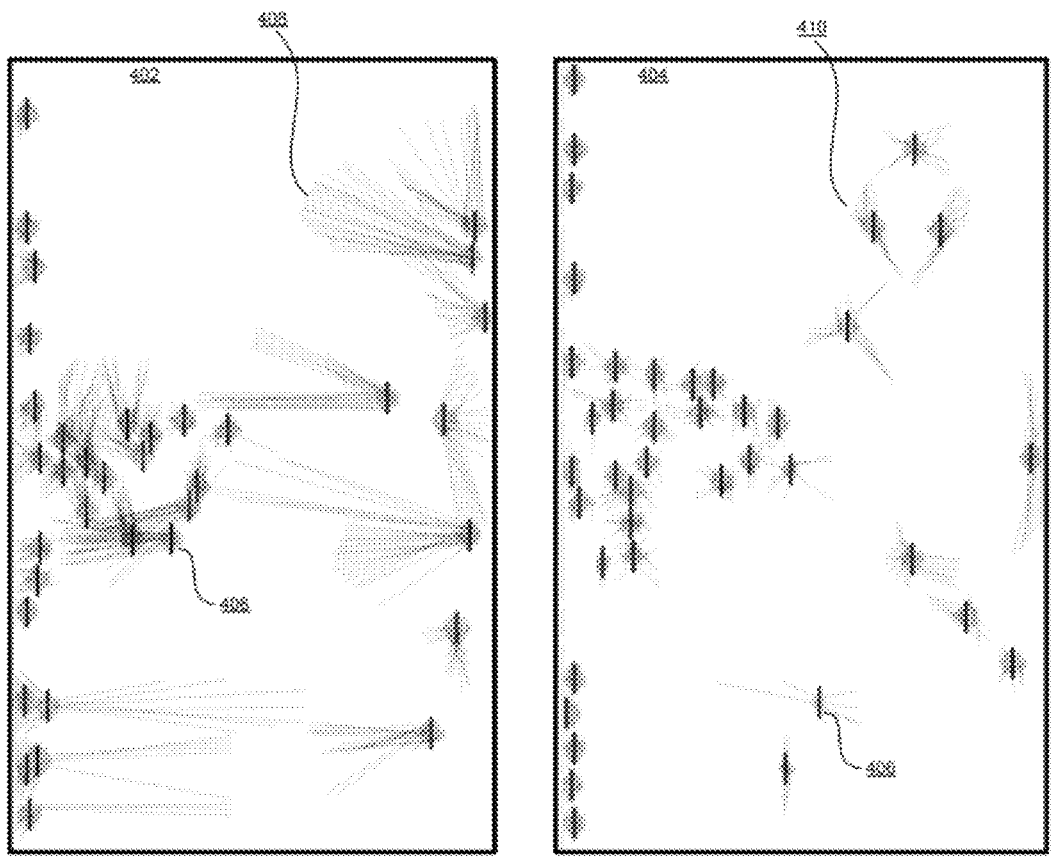
FIG. 4 depicts an example in Prism with respect to latch clustering with proximity to local clock buffers in accordance with an illustrative embodiment.

With reference to FIG. 4, this figure depicts a block diagram of an example of an improved latch placement generated by an electronic design automation system improved in accordance with an illustrative embodiment. The improved latch placement may be generated from system 105 in FIG. 1 that has been improved using an embodiment. As shown in first latch displacement example 402, latch trail illustrates how far a latch moved from the latch's optimal placement to LCB 406. In first latch displacement example 402, fifty-six (56) LCBs were used, the minimum number of LCBs 406 based on the initial latch clustering as determined by the electronic design automation system.

Second latch displacement example 404, illustrates the improvement on the distance a latch moved from the latch's optimal placement to LCB 406. By increasing the number of LCBs 406 from fifty-six (56) to sixty-three (63), latch displacement is greatly reduced. In one embodiment, the maximum number of LCBs 406 that could have been used in second latch displacement example 404, may have been sixty-five (65). However, because predetermined LCB proximity constraints were satisfied only using sixty-three (63) LCBs then sixty-three (63) LCBs were used instead of sixty-five (65) LCBs. In contrast to the maximum number of LCBs being based on the initial number of latch clusters as determined by the electronic design automation system, the maximum number of LCBs 406 is a design choice based on the power constrains of the system and other design factors such as latch displacement and LCB proximity constraints. Because the maximum number of LCBs 406 is a design choice and not based on the initial number of latch clusters, a balance between timing denegation and latch to local clock buffer timing constraints may be achieved.

Figure 5:
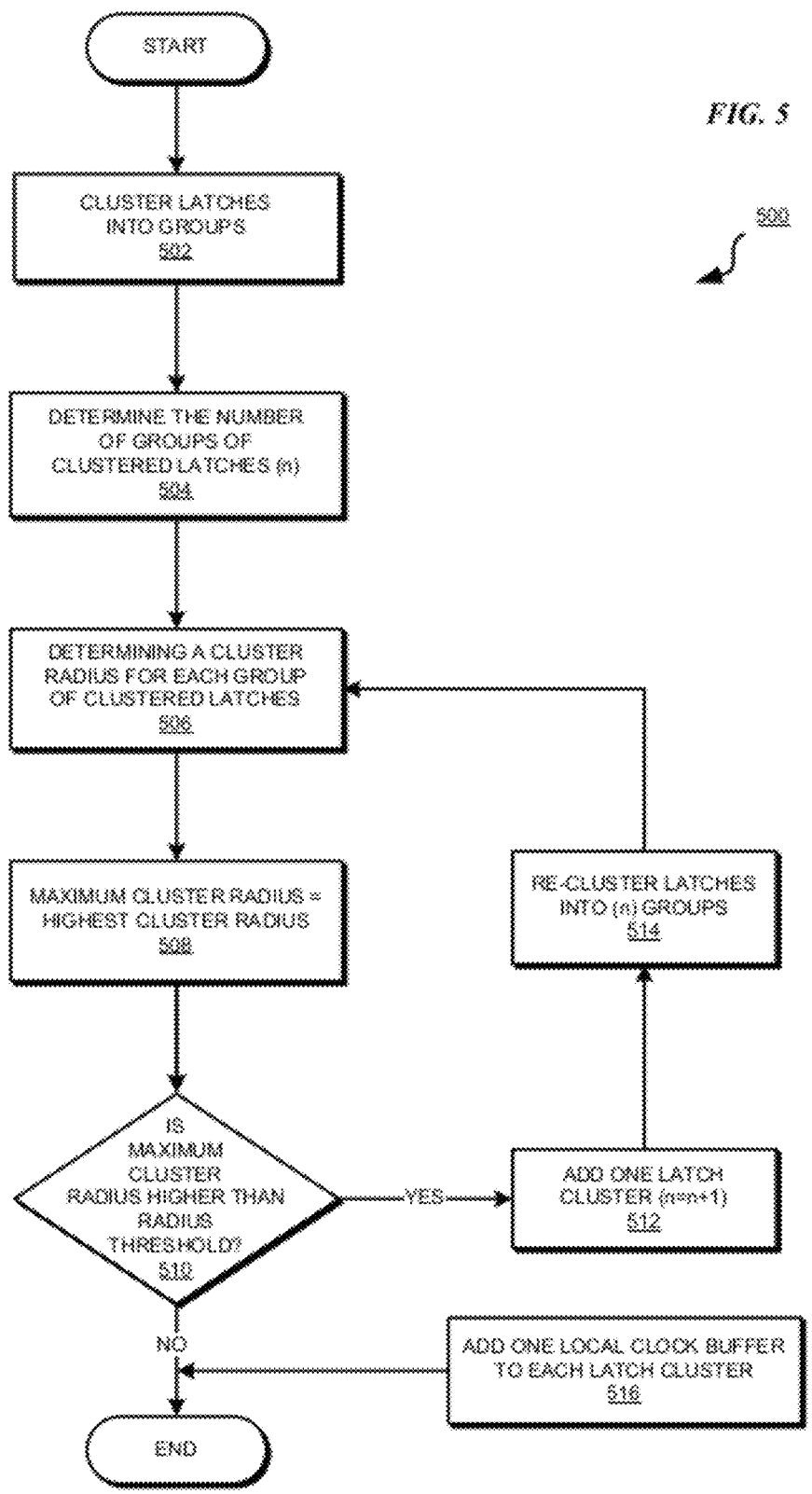
FIG. 5 depicts a flowchart of an example process for latch clustering with proximity to local clock buffers in accordance with an illustrative embodiment.

With reference to FIG. 5, this figure depicts a flowchart of an example process for latch clustering with proximity to local clock buffers in accordance with an illustrative embodiment. Process 500 may be implemented in data processing system 200 in FIG. 2.

Process 500 begins by clustering latches in a circuit design into groups (step 502). For example, in one embodiment, the latches are clustered into groups such as latches 304 in FIG. 3.

Process 500 determines the number of groups of clustered latches (n) (step 504). For example, in one embodiment, as shown in first latch clustering example 302 in FIG. 3, the number of clustered latches (n) is three (3) (n=3).

Process 500 determines a cluster radius for each group of clustered latches (step 506). The cluster radius is determined by finding the maximum distance between a latch in the cluster of latches to the center of gravity of the clustered latches. Process 500 sets the highest determined cluster radius as the maximum cluster radius (step 508). If process 500 determines that the maximum cluster radius is higher than a maximum radius threshold, ("Yes" path of step 510), process 500 allows one latch cluster to be added to the circuit design (n=n+1) (step 512).

Process 500 re-clusters the latches into n groups where the number of groups of clustered latches is one group more than the previous number of groups of clustered latches (step 514) and determines a cluster radius for each group of clustered latches (step 506) as described above. If process 500 determines that the maximum cluster radius is not higher than a maximum radius threshold, ("No" path of step 512), process 500 adds the same number of LCBs as the number of groups of clustered latches (n) (step 516), and process 500 ends thereafter. For example, in one embodiment, as shown in initial latch clustering example 402, in FIG. 4, the same number of LCBs 406, in FIG. 4, has been added as the number of groups of clustered latches.

Figure 6:
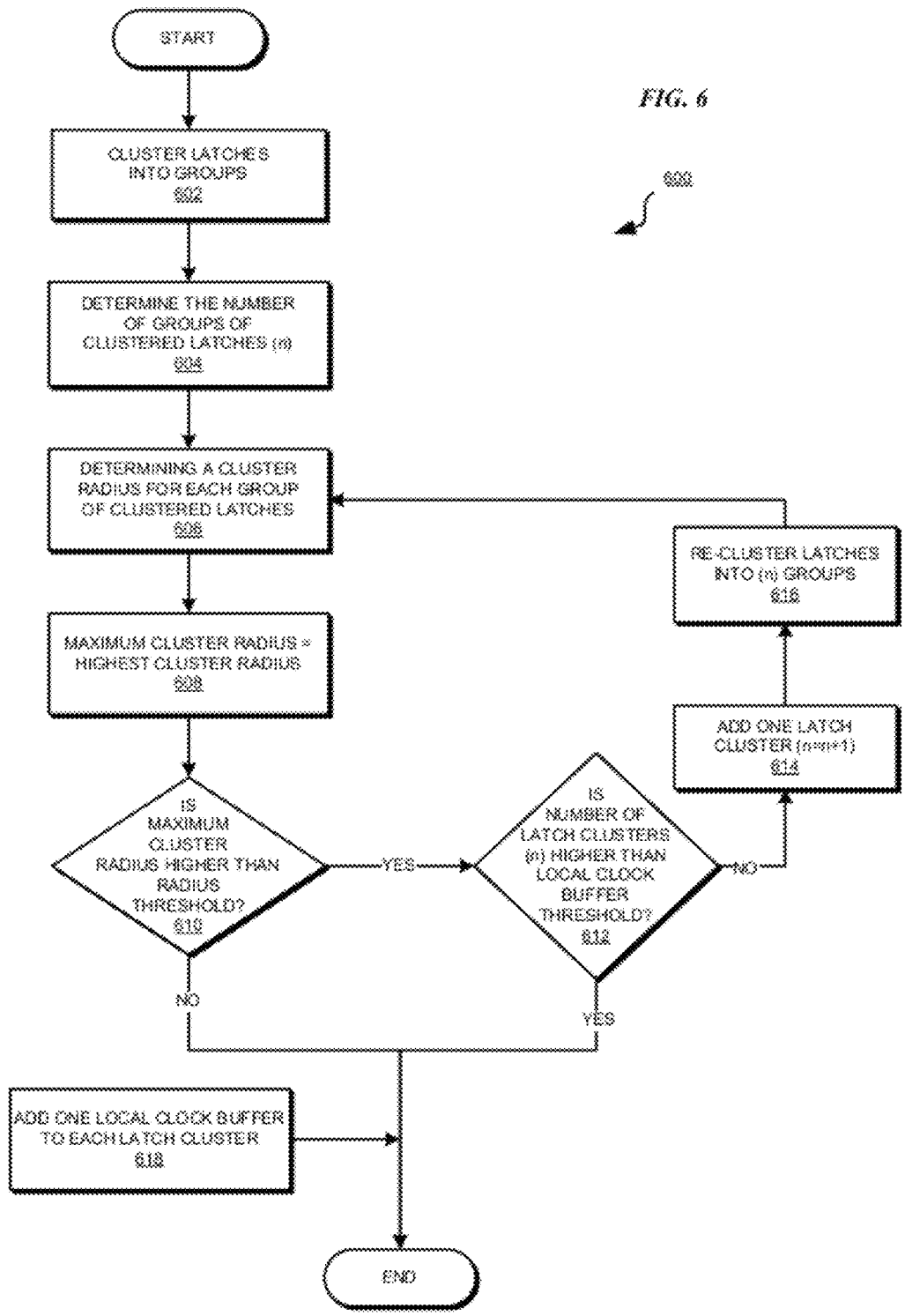
FIG. 6 depicts a flowchart of an example process for latch clustering with proximity to local clock buffers in accordance with an illustrative embodiment.

With reference to FIG. 6, this figure depicts a flowchart of an example process for latch clustering with proximity to local clock buffers in accordance with an illustrative embodiment. Process 600 may be implemented in data processing system 200 in FIG. 2.

Process 600 begins by clustering latches in a circuit design into groups (step 602). For example, in one embodiment, the latches are clustered into groups such as latches 304 in FIG. 3. Process 600 determines the number of groups of clustered latches (n) (step 604). For example, in one embodiment, as shown in first latch clustering example 302 the number of clustered latches is three (3) in FIG. 3 (n=3).

Process 600 determines a cluster radius for each group of clustered latches (step 606). The cluster radius is determined by finding the maximum distance between a latch in the cluster of latches to the center of gravity of the clustered latches. Process 600 sets the highest determined cluster radius as the maximum cluster radius (step 608). If process 600 determines that the maximum cluster radius is higher than a maximum radius threshold, ("Yes" path of step 610), process 600 determines if the number of groups of clustered latches (n) is equal to an LCB threshold. If process 600 determines that the number of groups of clustered latches (n) is not equal to an LCB threshold, ("No" path of step 612), process 600 allows one latch cluster to be added to the circuit design (n=n+1) (step 614).

Figure 7:
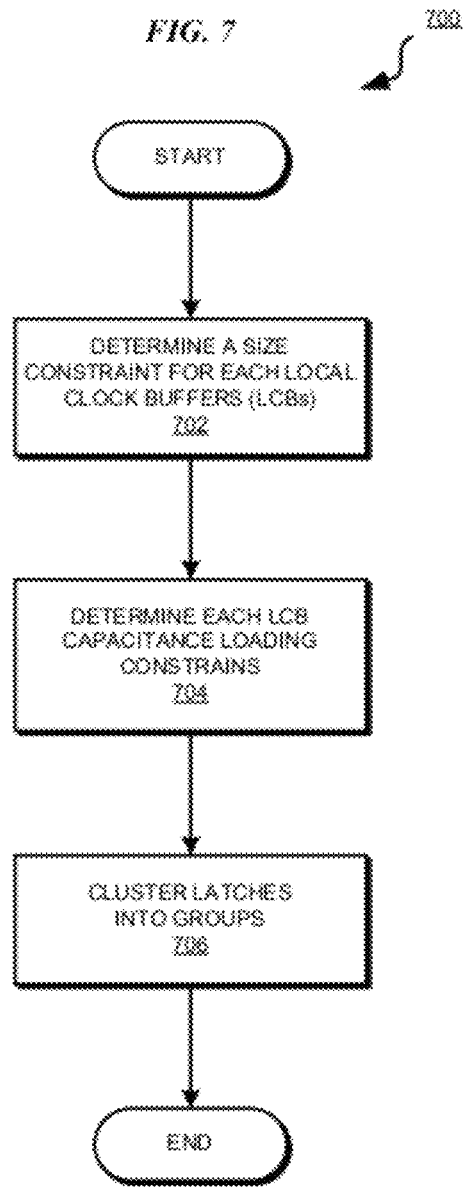
FIG. 7 depicts a flowchart of an example process for latch clustering with proximity to local clock buffers in accordance with an illustrative embodiment.

Process 600 re-clusters the latches into n groups where the number of groups of clustered latches is one group more than the previous number of groups of clustered latches (step 616) and determines a cluster radius for each group of clustered latches (step 606) as described above. If process 600 determines that the number of groups of clustered latches (n) is equal to an LCB threshold, ("Yes" path of step 614), process 600 adds the same number of LCBs as the number of groups of clustered latches (n) (step 618), and process 600 ends thereafter. For example, in one embodiment, as shown in initial latch clustering example 402, in FIG. 4, the same number of LCBs 406, in FIG. 4, has been added as the number of groups of clustered latches. as determined by the electronic design automation system With reference to FIG. 7, this figure depicts a flowchart of an example process for latch clustering with proximity to local clock buffers in accordance with an illustrative embodiment. Process 700 may be implemented in data processing system 200 in FIG. 2.

Process 700 begins by determining a size constraint for each LCB to be used in a circuit layout (step 702). For example, each LCB may be able to drive at most 24, 26, or 32 latches. The maximum number of latches each LCB can drive depends on the type of LCB and/or the circuit layout or topology.

Process 700 determines a capacitance loading constraint for each LCB to be used in the circuit layout (step 704). Process 700 clusters the latches in the circuit layout into groups around each LCB based on the determined size constraint and capacitance loading constraint (step 706), and process 700 ends thereafter. For example, a K-center clustering algorithm, or some other similar algorithm used for clustering may be used to cluster the latches.

The components in the block diagrams and the steps in the flowcharts described above are described only as examples. The components and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Thus, a computer implemented method, apparatus, and computer program product are provided in the illustrative embodiments for latch clustering with proximity to local clock buffers. The numbers of clusters, groups, sets, or latches used in the figures and corresponding description are only examples and are not intended to be limiting on the invention. Similarly, any values described or computed using the specific example groups, such as maxima or minima, are also only examples without implying a limitation on the invention. Using an embodiment of the invention, information resources and information resource redirects can be managed.

Although the embodiments are described using examples of data processing systems and devices or components of data processing systems, such examples are not limiting on the invention. An embodiment may be implemented in any device capable of storing data, and in any system where such device may be used within the scope of the invention. Some examples of other types of devices within the scope of the invention may be controller modules, sensors, and other electromechanical components. Such devices may be usable in conjunction with automobiles, engineering equipment, machinery, or tools within the scope of the invention.

The invention can take the form of an entirely software embodiment, or an embodiment containing both hardware and software elements. In a preferred embodiment, the invention is implemented in software or program code, which includes but is not limited to firmware, resident software, and microcode.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer implemented method for latch clustering with proximity to local clock buffers, the computer implemented method comprising:
    clustering, using a processor and a memory, a plurality of latches into a first plurality of groups in an integrated circuit, wherein the plurality of latches are clustered using a clustering algorithm;
    determining a number of groups in the first plurality of groups of clustered latches;
    adding a plurality of local clock buffers (LCBs) where a number of added LCBs in the plurality of local clock buffers is the same as the number of groups in the first plurality of groups of clustered latches;
    determining a cluster radius for a subset of the first plurality of groups of clustered latches, a group in the subset having a cluster radius that is a maximum cluster radius in the subset; and
    reclustering the plurality of latches into a second plurality of groups responsive to the maximum cluster radius exceeding a radius threshold, the second plurality of groups exceeding the first plurality of groups by one, wherein reclustering the plurality of latches into the second plurality of groups is further responsive to the number of groups in the first plurality of groups of clustered latches being equal to or less than a maximum number of LCBs.

2. The computer implemented method of claim 1, wherein the maximum number of LCBs is based on power constraints of the integrated circuit.

3. The computer implemented method of claim 1, wherein the maximum cluster radius is based on a predetermined latch to LCB constraint.

4. The computer implemented method of claim 1, wherein a K-center clustering algorithm is used to cluster the latches into groups.

5. The computer implemented method of claim 1, wherein a timing degradation of a latch is reduced.

6. A data processing system for latch clustering with proximity to local clock buffers, the data processing system comprising:
    a storage device including a storage medium, wherein the storage device stores computer usable program code; and
    a processor, wherein the processor executes the computer usable program code, and wherein the computer usable program code comprises:
    computer usable code for clustering a plurality of latches into a first plurality of groups in an integrated circuit, wherein the plurality of latches are clustered using a clustering algorithm;
    computer usable code for determining a number of groups in the first plurality of groups of clustered latches;
    computer usable code for adding a plurality of local clock buffers (LCBs) where a number of added LCBs in the plurality of local clock buffers is the same as the number of groups in the first plurality of groups of clustered latches;
    computer usable code for determining a cluster radius for a subset of the first plurality of groups of clustered latches, a group in the subset having a cluster radius that is a maximum cluster radius in the subset; and
    computer usable code for reclustering the plurality of latches into a second plurality of groups responsive to the maximum cluster radius exceeding a radius threshold, the second plurality of groups exceeding the first plurality of groups by one, wherein reclustering the plurality of latches into the second plurality of groups is further responsive to the number of groups in the first plurality of groups of clustered latches being equal to or less than a maximum number of LCBs.

7. The data processing system of claim 6, wherein the maximum number of LCBs is based on power constraints of the integrated circuit.

8. The data processing system of claim 6, wherein the maximum cluster radius is based on a predetermined latch to LCB constraint.

9. The data processing system of claim 6, wherein a K-center clustering algorithm is used to cluster the latches into groups.

10. The data processing system of claim 6, wherein a timing degradation of a latch is reduced.

11. A computer usable program product comprising a computer usable storage device including computer usable code for latch clustering with proximity to local clock buffers, the computer usable code comprising:
   computer usable code for determining at an application executing in a data processing system, a set of parameters associated with a device;
   computer usable code for clustering a plurality of latches into a first plurality of groups in an integrated circuit, wherein the plurality of latches are clustered using a clustering algorithm;
   computer usable code for determining a number of groups in the first plurality of groups of clustered latches;
   computer usable code for adding a plurality of local clock buffers (LCBs) where a number of added LCBs in the plurality of local clock buffers is the same as the number of groups in the first plurality of groups of clustered latches;
   computer usable code for determining a cluster radius for a subset of the first plurality of groups of clustered latches, a group in the subset having a cluster radius that is a maximum cluster radius in the subset; and
   computer usable code for reclustering the plurality of latches into a second plurality of groups responsive to the maximum cluster radius exceeding a radius threshold, the second plurality of groups exceeding the first plurality of groups by one, wherein reclustering the plurality of latches into the second plurality of groups is further responsive to the number of groups in the first plurality of groups of clustered latches being equal to or less than a maximum number of LCBs.

12. The computer usable program product of claim 11, wherein the maximum number of LCBs is based on power constraints of the integrated circuit.

13. The computer usable program product of claim 11, wherein the maximum cluster radius is based on a predetermined latch to LCB constraint.

14. The computer usable program product of claim 11, wherein a K-center clustering algorithm is used to cluster the latches into groups.

15. The computer usable program product of claim 11, wherein a timing degradation of a latch is reduced.

16. The computer usable program product of claim 11, wherein the computer usable code is stored in a computer readable storage medium in a data processing system, and wherein the computer usable code is transferred over a network from a remote data processing system.

17. The computer usable program product of claim 11, wherein the computer usable code is stored in a computer readable storage medium in a server data processing system, and wherein the computer usable code is downloaded over a network to a remote data processing system for use in a computer readable storage medium associated with the remote data processing system.

\* \* \* \* \*